(12) United States Patent
Song

(10) Patent No.: US 10,879,321 B2
(45) Date of Patent: Dec. 29, 2020

(54) DISPLAY DEVICE

(71) Applicant: SAMSUNG DISPLAY CO., LTD., Yongin-si (KR)

(72) Inventor: Sung Hoon Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/000,050

(22) Filed: Jun. 5, 2018

(65) Prior Publication Data

US 2019/0088727 A1 Mar. 21, 2019

(30) Foreign Application Priority Data

Sep. 21, 2017 (KR) .......................... 10-2017-0121772

(51) Int. Cl.
*H01L 27/32* (2006.01)
*H01L 51/52* (2006.01)
*H01L 51/00* (2006.01)
*H01L 27/12* (2006.01)

(52) U.S. Cl.
CPC ........ *H01L 27/3246* (2013.01); *H01L 27/124* (2013.01); *H01L 27/1214* (2013.01); *H01L 27/3276* (2013.01); *H01L 51/0096* (2013.01); *H01L 51/5218* (2013.01); *H01L 51/5234* (2013.01); *H01L 51/5243* (2013.01); *H01L 51/5246* (2013.01)

(58) Field of Classification Search
None
See application file for complete search history.

(56) References Cited

U.S. PATENT DOCUMENTS

2016/0276620 A1* 9/2016 Hong .................. H01L 51/5243
2017/0148863 A1 5/2017 Yoon et al.

FOREIGN PATENT DOCUMENTS

KR 10-2013-0066439 A 6/2013
KR 10-2014-0080229 A 6/2014

* cited by examiner

*Primary Examiner* — Jack S Chen
(74) *Attorney, Agent, or Firm* — Kile Park Reed & Houtteman PLLC

(57) ABSTRACT

A display device includes: a first substrate including a display region and a non-display region provided at at least one side of the display region; a plurality of pixel units provided in the display region on the first substrate; a metal pattern provided in the non-display region on the first substrate; and a second substrate opposite to the first substrate, the second substrate being joined with the first substrate to encapsulate the display region, wherein the metal pattern includes a material having a high reactivity with oxygen as compared with an organic material.

11 Claims, 3 Drawing Sheets

DISPLAY DEVICE

CROSS-REFERENCE TO RELATED APPLICATION

Korean Patent Application No. 10-2017-0121772, filed on Sep. 21, 2017, in the Korean Intellectual Property Office, and entitled: "Display Device," is incorporated by reference herein in its entirety.

BACKGROUND

1. Field

Embodiments relate to a display device.

2. Description of the Related Art

Display devices have come into the spotlight because of their light weight and thin thickness. Among the display devices, an organic light emitting display device is a self-luminescent display device that displays an image using organic light emitting diodes that emit light, and does not require any separate light source. Also, the organic light emitting display device has low power consumption, high luminance, and high speed of response, and thus has drawn attention as a next-generation display device.

SUMMARY

Embodiments are directed to a display device including: a first substrate including a display region and a non-display region provided at at least one side of the display region; a plurality of pixel units provided in the display region on the first substrate; a metal pattern provided in the non-display region on the first substrate; and a second substrate opposite to the first substrate, the second substrate being joined with the first substrate to encapsulate the display region, wherein the metal pattern includes a material having a high reactivity with oxygen as compared with an organic material.

BRIEF DESCRIPTION OF THE DRAWINGS

Features will become apparent to those of skill in the art by describing in detail example embodiments with reference to the attached drawings in which.

DETAILED DESCRIPTION

Figure 1:
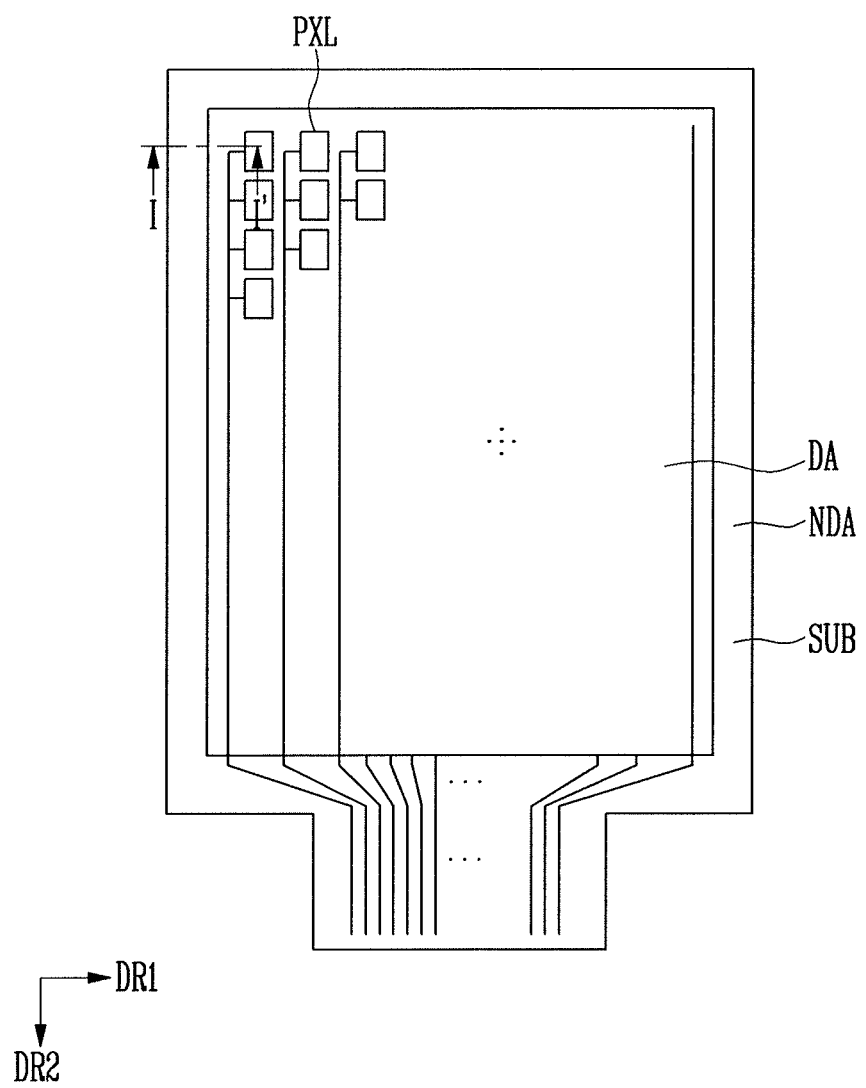
FIG. 1 illustrates a plan view illustrating a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

FIG. 1 is a plan view illustrating a display device according to an example embodiment.

Referring to FIG. 1, the display device according to the present example embodiment includes a display region DA and a non-display region NDA provided at at least one side of the display region DA.

The display device may have an approximately quadrangular shape, for example, a rectangular shape. In the present example embodiment, the display device may include a pair of short sides parallel to each other in a first direction DR1 and a pair of long sides parallel to each other in a second direction DR2. However, the shape of the display device is not limited thereto, and the display device may have various shapes. For example, the display device may be provided in various shapes such as a closed polygon including linear sides, a circle, an ellipse, etc., including curved sides, and a semicircle, a semi-ellipse, etc., including linear and curved sides.

In an example embodiment, when the display device has linear sides, at least one portion of corners of each of the shapes may be formed in a curve. For example, when the display device has a rectangular shape, a portion at which adjacent linear sides meet each other may be replaced with a curve having a predetermined curvature. Thus, a vertex portion of the rectangular shape may be formed with a curved side having both adjacent ends respectively connected to two adjacent linear sides, the curved side having a predetermined curvature. The curvature may be differently set depending on a position. For example, the curvature may be changed depending on a position at which the curve is started, a length of the curve, etc.

The display region DA may be a region in which a plurality of pixel units PXL are provided to display an image. The display region DA may be provided in a shape corresponding to that of the display device. For example, like the shape of the display device, the display region DA may be provided in various shapes such as a closed polygon including linear sides, a circle, an ellipse, etc., including curved sides, and a semicircle, a semi-ellipse, etc., including linear and curved sides. In an example embodiment, when the display region DA has linear sides, at least a portion of corners of each of the shapes may be formed in a curve.

The pixel units PXL are provided in the display region DA. Each pixel unit PXL may be a minimum unit for displaying an image, and may be provided in plurality. The pixel units PXL may emit white light and/or colored light. Each pixel unit PXL, may emit light of one of red, green, and blue. However, the present example embodiment is not limited thereto, and each pixel unit PXL may emit light of a color such as cyan, magenta, or yellow.

Each of the pixel units PXL may be a light emitting device including an organic emitting layer. However, the present example embodiment is not limited thereto, and the pixel unit PXL may be implemented in various forms such as a liquid crystal device, an electrophoretic device, or an electrowetting device.

In an example embodiment, the non-display region NDA may further include an additional region protruding from a portion thereof. The additional region may protrude from sides constituting the non-display region NDA. In an example embodiment, a case where the additional region protrudes from a side corresponding to one of short sides of a first substrate SUB is illustrated as an example. However, the additional region may protrude from one of long sides of the first substrate SUB, or be provided in a shape protruding from two sides among the four sides of the first substrate SUB. In an example embodiment, a data driver may be provided or connected to the additional region. However, the present example embodiment is not limited thereto, and various components may be disposed in the additional region.

Figure 2:
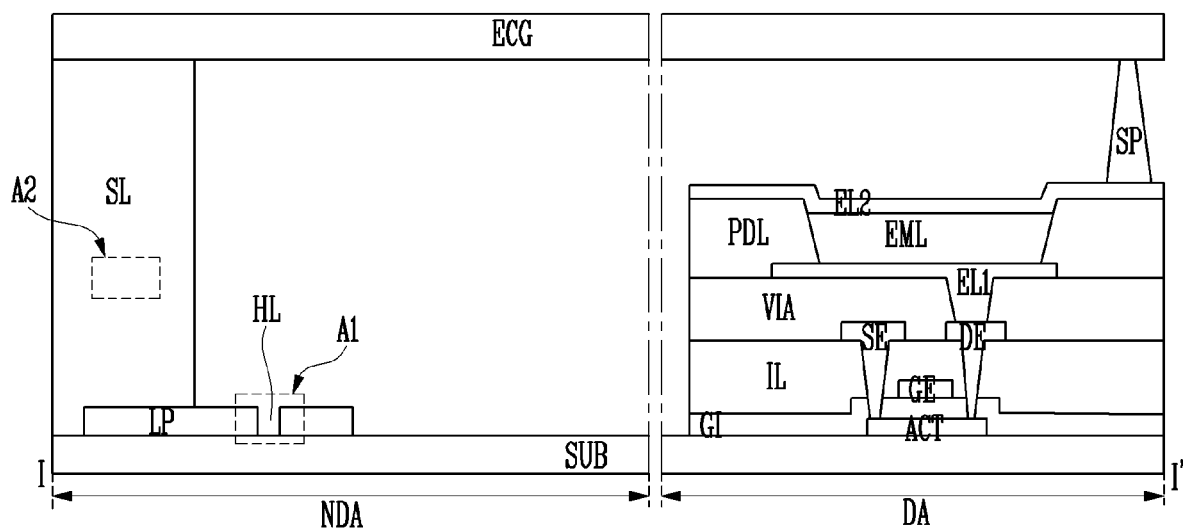
FIG. 2 illustrates a sectional view taken along line I-I' of FIG. 1.

FIG. 2 is a sectional view taken along line I-I' of FIG. 1.

In the example embodiment illustrated in FIG. 2, the display device is divided into the display region DA and the non-display region NDA, and may include the first substrate SUB, a thin film transistor provided on the first substrate SUB, a light emitting device electrically connected to the thin film transistor, a metal pattern LP provided in the non-display region NDA on the first substrate SUB, and a second substrate ECG opposite to the first substrate SUB.

The first substrate SUB may include a transparent insulating material to enable light to be transmitted therethrough. The first substrate SUB may be a rigid substrate. For example, the first substrate SUB may be one of a glass substrate, a quartz substrate, a glass ceramic substrate, and a crystalline glass substrate.

In addition, the first substrate SUB may be a flexible substrate. Here, the first substrate SUB may be one of a film substrate and a plastic substrate, including a polymer organic material. For example, the first substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the first substrate SUB may be variously changed, and include a fiber reinforced plastic (FRP), etc.

A buffer layer (not shown) may be provided on the first substrate SUB. The buffer layer may help prevent impurities from being diffused into, for example, the switching and driving transistors. The buffer layer may be an inorganic insulating layer made of an inorganic material. For example, the buffer layer may be formed of silicon nitride, silicon oxide, silicon oxynitride, etc. The buffer layer may be omitted according to material and process conditions.

The thin film transistor may be provided in the pixel unit of the display region DA. The thin film transistor may include a semiconductor layer ACT, a gate electrode GE, a source electrode SE, and a drain electrode DE.

The semiconductor layer ACT may be provided on the first substrate SUB. The semiconductor layer ACT may include amorphous silicon, crystalline silicon, organic semiconductor, or oxide semiconductor.

The gate electrode GE may be provided on the semiconductor layer ACT. The gate electrode GE may apply an electric field to the semiconductor layer ACT. A current may flow or not flow in a channel region of the semiconductor layer ACT according to the electric field applied to the semiconductor layer ACT.

The gate electrode GE may include a conductive material. For example, the gate electrode GE may include one or more of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), or an alloy thereof.

A gate insulating layer GI may be provided between the gate electrode GE and the semiconductor layer ACT. The gate insulating layer GI allows the gate electrode GE and the semiconductor layer ACT to be insulated from each other therethrough.

An interlayer insulating layer IL may be provided over the gate electrode GE.

The interlayer insulating layer IL may have a single- or multi-layered structure. Also, the interlayer insulating layer IL may include at least one of an inorganic insulating material and an organic insulating material. For example, when the interlayer insulating layer IL has a single-layered structure of an inorganic insulating material, the interlayer insulating layer IL may include one of a silicon oxide layer, a silicon nitride layer, and a silicon oxynitride layer. When the interlayer insulating layer IL has a multi-layered structure of an inorganic insulating material, the interlayer insulating layer IL may have a structure in which a silicon oxide layer and a silicon nitride layer are alternately stacked. When the interlayer insulating layer IL has a single-layered structure of an organic insulating material, the interlayer insulating layer IL may include at least one of acryl, polyimide, polyamide, and benzocyclobutene. When the interlayer insulating layer IL has a multi-layered structure of an organic insulating material, the interlayer insulating layer IL may have a structure in which the above-described materials are stacked in several layers. Also, the interlayer insulating layer IL may also have a structure in which an inorganic insulating layer and an organic insulating layer are alternately stacked.

The source electrode SE and the drain electrode DE may be provided on the interlayer insulating layer IL.

The source electrode SE and the drain electrode DE may be in contact with a source region and a drain region of the semiconductor layer ACT through contact holes passing through the gate insulating layer GI and the interlayer insulating layer IL, respectively.

A protective layer VIA may be provided over the source electrode SE and the drain electrode DE. The protective layer VIA may include at least one of an inorganic insulating layer made of an inorganic material and an organic insulating layer made of an organic material. For example, the protective layer VIA may include an inorganic insulating layer and an organic insulating layer on the inorganic insulating layer. The inorganic insulating layer may include one or more of polysiloxane, silicon nitride, silicon oxide, silicon oxynitride, or equivalents thereof. The organic insulating layer may include one or more of polyacrylate resin, epoxy resin, phenolic resin, polyamide resin, polyimide resin, unsaturated polyester resin, polyphenylene ether resin, polyphenylene sulfide resin, or benzocyclobutene resin.

A first electrode EL1, an emitting layer EML, and a second electrode EL2 may be provided on the protective layer VIA. The first electrode EL1, the emitting layer EML, and the second electrode EL2 may constitute a light emitting device that performs a function of receiving a signal applied to the thin film transistor to emit light.

Any one of the first electrode EL1 and the second electrode EL2 may be an anode electrode, and the other of the first electrode EL1 and the second electrode EL2 may be a cathode electrode. For example, when the first electrode EL1 may be an anode electrode, and the second electrode EL2 may be a cathode electrode. When the light emitting device is a top emission type organic light emitting device, the first electrode EL1 may be a reflective electrode, and the second electrode EL2 may be a transmissive electrode. In an example embodiment, a case where the light emitting device is a top emission type organic light emitting device, and the first electrode EL1 is an anode electrode is described as an example.

The first electrode EL1 may be electrically connected to the drain electrode DE through a contact hole passing through the protective layer VIA. The first electrode EL1 may include a reflective layer capable of reflecting light and a transparent conductive layer disposed on the top or bottom of the reflective layer. At least one of the transparent conductive layer and the reflective layer may be electrically connected to the drain electrode DE.

A pixel defining layer PDL having an opening that allows a portion of the first electrode EL1, e.g., a top surface of the first electrode EL1 to be exposed therethrough may be further provided on the protective layer VIA. The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be provided on the exposed surface of the first electrode EL1.

The emitting layer EML may include a low-molecular or high-molecular material. In an example embodiment, the low-molecular material may include, for example, copper phthalocyanine (CuPc), N,N'-Di(naphthalene-1-yl)-N,N'-diphenyl-benzidine (NPB), tris-8-hydroxyquinoline aluminum (Alq3), and the like. The high-molecular material may include, for example, poly(3,4-ethylenedioxythiophene (PEDOT)-, poly(phenylene-vinylene) (PPV)-, or poly(fluorine)-based materials.

The emitting layer EML may be provided as a single layer, but may be provided as a multi-layer including various functional layers. When the emitting layer EML is provided as a multi-layer, the emitting layer EML may have a structure in which a hole injection layer, a hole transport layer, an emission layer, an electron transport layer, an electron injection layer, and the like are stacked in a single or complex structure. The form of the emitting layer EML is not limited thereto. The emitting layer EML may have various structures in addition to the above-described structure. In addition, at least a portion of the emitting layer EML may be integrally formed throughout a plurality of first electrodes EL1, or be individually provided to correspond to each of the plurality of first electrodes EL1. The color of light generated in the emitting layer EML may be one of red, green, blue, and white, but the present example embodiment is not limited thereto. For example, the color of light generated in a light generation layer of the emitting layer EML may be one of magenta, cyan, and yellow.

The second electrode EL2 may be provided on the emitting layer EML. The second electrode EL2 may be a semi-transmissive reflective layer. For example, the second electrode EL2 may be a thin metal layer having a thickness, through which light emitted through the emitting layer EML may be transmitted. The second electrode EL2 may allow a portion of the light emitted from the emitting layer EML to be transmitted therethrough, and allow the rest of the light emitted from the emitting layer EML to be reflected therefrom.

A spacer SP may be provided on the second electrode EL2. The spacer SP may allow the pixel unit in which the second electrode EL2 is provided to be spaced part from the second substrate ECG.

The second substrate ECG opposite to the first substrate SUB may be joined with the first substrate SUB to encapsulate the display region DA.

The second substrate ECG may include the same material as the first substrate SUB. For example, when the first substrate SUB is a rigid substrate, the second substrate ECG may also be a rigid substrate. In addition, when the first substrate SUB is a flexible substrate, the second substrate ECG may also be a flexible substrate.

In the non-display region NDA, the metal pattern LP is provided on the first substrate SUB. The metal pattern LP includes a material having a high reactivity with oxygen as compared with an organic material. The material having the high reactivity with oxygen as compared with the organic material may have an electron affinity higher than that of the organic material. Accordingly, oxygen introduced into the display device from the outside or oxygen generated in the display device as the display device is driven does not react with the organic material but reacts with the metal pattern LP. In this case, the organic material may be included in the emitting layer EML and the like, and the metal pattern LP may include a material having a high reactivity with oxygen as compared with an organic material included in, for example, one or more of a hole injection layer, a hole transport layer, an emission layer, an electron transport layer, or an electron injection layer.

If an organic material included in the emitting layer EML reacts with oxygen, the function of display device may be degraded due to a change of the molecular structure of the organic material. In the present example embodiment, the metal pattern LP having a relatively high reactivity with oxygen is present, and the reaction between oxygen and the organic material may be suppressed. Accordingly, the lifespan of the display device may be improved.

Here, that the reactivity with oxygen is high may be explained with a difference in electron affinity, in which case the metal pattern may have an electron affinity higher than that of the organic material.

The metal pattern LP may include aluminum. In this case, the aluminum is not aluminum oxide (AlOx) but may be pure aluminum (Al) or aluminum (Al) metal.

Since the aluminum (Al) has a high electron affinity, the aluminum (Al) can easily react with oxygen. In addition, since the aluminum (Al) has a relatively small volume per mole, a large amount of aluminum (Al) may be provided in the same volume. Accordingly, the aluminum (Al) can react with a large number of oxygen in the same volume.

The metal pattern LP may include an opening HL that allows a section of the metal pattern LP to be exposed therethrough.

The metal pattern LP may be a signal line connected to the pixel units. The metal pattern LP may be a power line for applying a power source to the pixel unit.

A sealing member SL may be further provided at one side of the non-display region NDA. The sealing member SL allows the first substrate SUB and the second substrate ECG to be joined together, and may isolate a space between the first substrate SUB and the second substrate ECG from an external environment. The sealing member SL may be provided to overlap with a portion of the metal pattern LP as shown in FIG. 2. In addition, a portion of the metal pattern LP may be provided in a space sealed by the first substrate SUB, the second substrate ECG, and the sealing member SL. In the present example embodiment, a case where a portion of the sealing member SL overlaps with the metal pattern LP is described but the present example embodiment is not limited thereto. For example, the sealing member SL may be provided in a shape that does not overlap with the metal pattern LP on a plane.

The sealing member SL seals the display device such that gas including oxygen or liquid such as water is not introduced into the display device. A material having a high reactivity with oxygen as compared with an organic material may be included in the sealing member SL. The material having the high reactivity with oxygen as compared with the organic material may be, for example, pure aluminum (Al) or aluminum (Al) metal.

The aluminum (Al) may be included in the form of particles in the sealing member SL. For example, the sealing member SL including aluminum particles may be made by providing a paste including aluminum oxide in the non-display region and then locally heating and reducing the aluminum oxide to unoxidized aluminum. According to the present example embodiment, only the region of the sealing member SL is locally heated, so that the emitting layer EML and the like, which include the organic material, are not degraded in a heating process for reducing the aluminum oxide.

The metal pattern LP may be formed of the same material as the source electrode SE and the drain electrode DE. In addition, the metal pattern LP, the source electrode SE, and the drain electrode DE may be formed through the same process.

Figure 3:
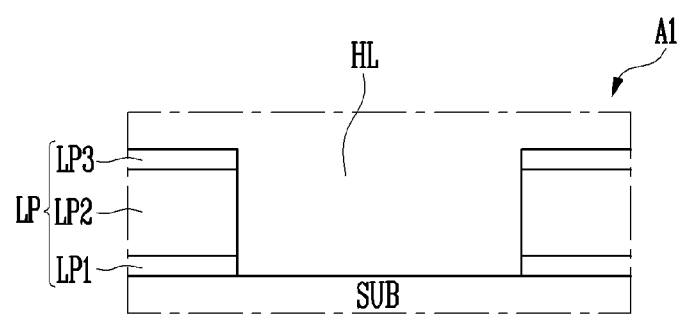
FIG. 3 illustrates an enlarged sectional view of region A1 of FIG. 2.

FIG. 3 is an enlarged sectional view of region A1 of FIG. 2.

Referring to FIG. 3, the metal pattern LP may be provided in a multi-layered structure. For example, the metal pattern LP may include first to third conductive layers LP1 to LP3, which are sequentially provided.

The second conductive layer LP2 may include a material having a high reactivity with oxygen as compared with an organic material. In this case, the material having the high reactivity with oxygen as compared with the organic material may be aluminum (Al), as described above. The first conductive layer LP1 and the third conductive layer LP3, which are respectively formed on the top and bottom of the second conductive layer LP2, may include titanium (Ti).

The opening HL may be provided in the metal pattern LP, and may divide the metal pattern LP into two portions spaced apart from each other. In this case, both sides of the metal pattern LP, which are divided by the opening HL, may be electrically insulated from each other. Accordingly, only one of both the sides of the metal pattern LP may be electrically connected to the pixel unit, and the other of both the sides of the metal pattern LP may be electrically insulated from the pixel unit.

A section of the metal pattern LP may be exposed by the opening HL included in the metal pattern LP. For example, a section of the second conductive layer LP2 including the material having the high reactivity with oxygen as compared with the organic material may be exposed. The second conductive layer LP2 may react with oxygen on the exposed section thereof. Accordingly, oxygen may not react with the organic material included in the emitting layer EML and the like.

In order to form the opening HL, the metal pattern LP may be removed by irradiating laser onto a portion of the metal pattern LP.

Figure 4A:
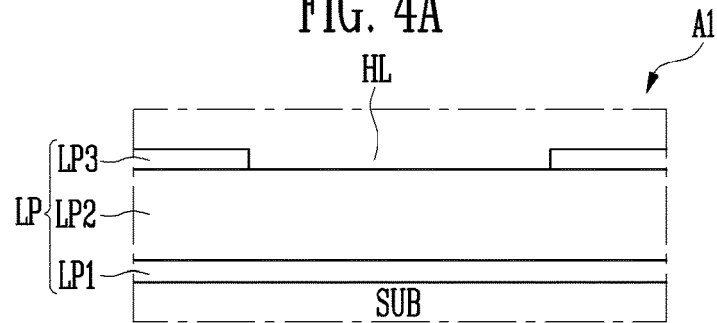
FIGS. 4A to 4C illustrate sectional views illustrating other embodiments of the region A1 of FIG. 2.
Figure 4B:
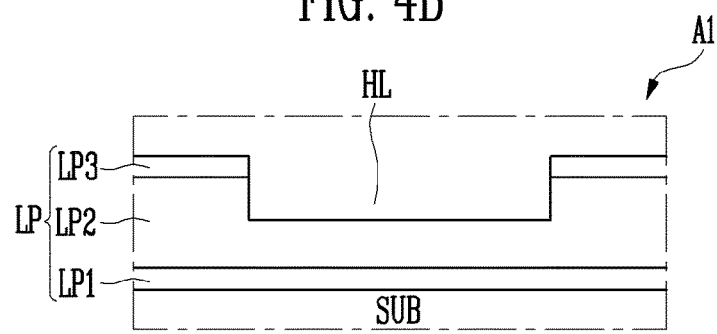
Figure 4C:
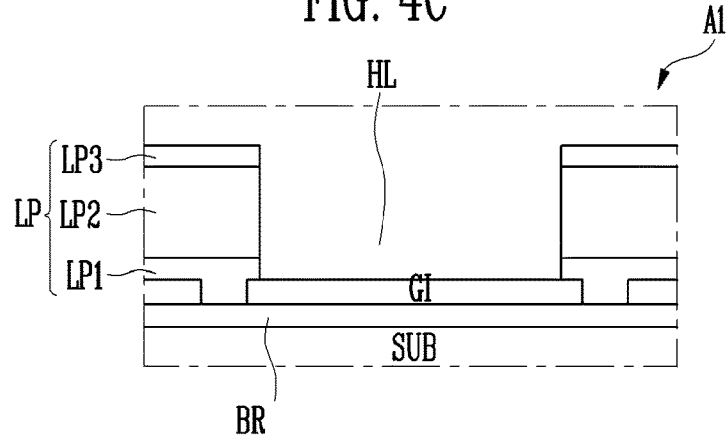

FIGS. 4A to 4C are sectional views illustrating other example embodiments of the region A1 of FIG. 2.

FIGS. 4A and 4B illustrate that the opening HL has different depths. In the case of FIG. 4A, the opening HL has a depth in which only a side surface of the third conductive layer LP3 is exposed. In the case of FIG. 4B, the opening HL may be provided in a shape that does not completely divide the second conductive layer LP2. In both of the two cases, as the second conductive layer LP2 is exposed, the second conductive layer LP and oxygen may react with each other.

Referring to FIG. 4C, the metal pattern LP is divided into two portions spaced apart from each other by the opening HL. However, unlike the embodiment shown in FIG. 3, the two portions of the metal pattern LP, which are spaced apart from each other by the opening HL, are electrically connected to each other. For example, the two portion of the metal pattern LP may be connected to each other by a bridge BR provided between the first substrate SUB and the metal pattern LP.

The two portions of the metal pattern LP, which are spaced apart from each other, are connected to each other by the bridge BR, so that the area of a power line may be sufficiently ensured when the metal pattern LP is used as the power line.

The bridge BR may be provided between the first substrate SUB and the gate insulating layer GI. The bridge BR may be formed of the same material through the same process as the semiconductor layer ACT.

Figure 5:
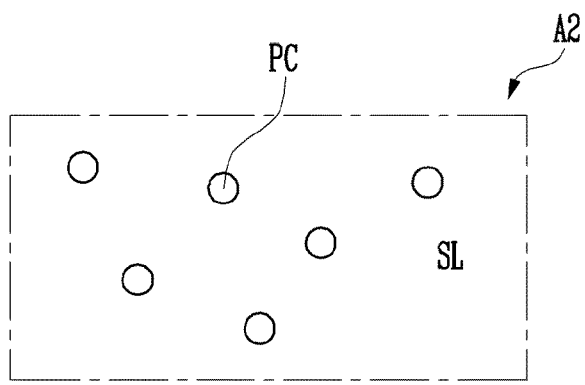
FIG. 5 illustrates an enlarged sectional view of region A2 of FIG. 2.

FIG. 5 is an enlarged sectional view of region A2 of FIG. 2.

In the example embodiment illustrated in FIG. 5, particles PC including a material having a high reactivity with oxygen as compared with an organic material are embedded in the sealing member SL. The particles may react with oxygen introduced from the outside. Thus, the oxygen introduced from the outside may react with the particles without passing through the sealing member SL. Thus, the amount of oxygen introduced between the first substrate SUB and the second substrate ECG, which are sealed by the sealing member SL, may be reduced.

By way of summation and review, an organic light emitting display device may include a plurality of pixels, each of which includes an organic light emitting diode, a plurality of transistors for driving the organic light emitting diode, and at least one capacitor.

As described above, embodiments may provide a display device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device, comprising:
a first substrate including a display region and a non-display region disposed at at least one side of the display region;
a plurality of pixel units disposed in the display region on the first substrate;
a metal pattern disposed in the non-display region on the first substrate;
a sealing member disposed at one side of the non-display region; and
a second substrate opposite to the first substrate, the second substrate being joined with the first substrate to encapsulate the display region,
wherein:
the metal pattern includes a material having a high reactivity with oxygen as compared with an organic material,
the sealing member includes particles and the sealing member overlaps at least a portion of the metal pattern,
the metal pattern includes a first conductive layer, a second conductive layer disposed on the first conductive layer, and a third conductive layer disposed on the second conductive layer, and
the third conductive layer includes an opening exposing the second conductive layer,
wherein the second conductive layer includes a material having a high reactivity with oxygen as compared with the organic material,
wherein a portion of the metal pattern is disposed in a space sealed by the first substrate, the second substrate, and the sealing member, and wherein the first and third metal patterns include titanium (Ti).

2. The display device as claimed in claim 1, wherein each of the plurality of pixel units includes at least one transistor including:
a gate electrode;
a semiconductor layer disposed on the gate electrode; and
a source electrode and a drain electrode, disposed on the semiconductor layer,
wherein the metal pattern includes the same material as the source electrode and the drain electrode.

3. The display device as claimed in claim 1, wherein the material having a high reactivity with oxygen as compared with the organic material in the second conductive layer includes an aluminum metal.

4. The display device as claimed in claim 1, wherein the opening has a hole shape passing through the second conductive layer to at least a partial thickness of the second conductive layer.

5. The display device as claimed in claim 1, wherein a plurality of openings is disposed in the third conductive layer.

6. The display device as claimed in claim 2, wherein the metal pattern is a signal line electrically connected to the pixel units.

7. The display device as claimed in claim 6, further comprising a bridge connecting the metal pattern to the pixel units,
wherein the bridge is disposed between the first substrate and a gate insulating layer.

8. The display device as claimed in claim 7, wherein the bridge includes the same material as the semiconductor layer.

9. The display device as claimed in claim 1, wherein
the particles are dispersed in the sealing member, the particles including a material having a high reactivity with oxygen as compared with the organic material.

10. The display device as claimed in claim 9, wherein the material having the high reactivity with oxygen as compared with the organic material in the sealing member includes an aluminum metal.

11. The display device as claimed in claim 1, wherein the material having the high reactivity with oxygen as compared with the organic material has an electron affinity higher than that of the organic material.

* * * * *